(12) United States Patent
Puma et al.

(10) Patent No.: US 7,123,101 B2
(45) Date of Patent: Oct. 17, 2006

(54) PHASE LOCKED LOOP COMPRISING A ΣΔ MODULATOR

(75) Inventors: Giuseppe Li Puma, Bochum (DE); Elmar Wagner, Duisburg (DE)

(73) Assignee: Infineon Technologies AG, Munich (DE)

( * ) Notice: Subject to any disclaimer, the term of this patent is extended or adjusted under 35 U.S.C. 154(b) by 12 days.

(21) Appl. No.: 11/145,821

(22) Filed: Jun. 6, 2005

(65) Prior Publication Data

US 2006/0017511 A1 Jan. 26, 2006

Related U.S. Application Data

(63) Continuation of application No. PCT/DE03/03894, filed on Nov. 25, 2003.

(30) Foreign Application Priority Data

Dec. 6, 2002 (DE) .................. 102 57 185

(51) Int. Cl.
*H03L 7/18* (2006.01)
*H03B 19/00* (2006.01)
*H03M 3/00* (2006.01)
*H03M 3/02* (2006.01)
*H03K 21/00* (2006.01)

(52) U.S. Cl. .................. 331/16; 331/1 A; 331/25; 327/117; 341/143; 377/47

(58) Field of Classification Search .............. 331/1 A, 331/16, 18, 25; 327/115, 117–118, 156–159; 332/127; 341/143; 360/51; 375/376; 377/47; 455/260

See application file for complete search history.

(56) References Cited

U.S. PATENT DOCUMENTS

| 6,008,703 A | 12/1999 | Perrott et al. |
| 6,424,192 B1 | 7/2002 | Lee et al. |
| 6,844,836 B1 * | 1/2005 | Lee .................. 341/143 |

FOREIGN PATENT DOCUMENTS

| EP | 0 961 412 A1 | 12/1999 |
| GB | 2 252 879 A | 8/1992 |
| JP | 2001177404 A | 6/2001 |
| WO | 02/27936 A2 | 4/2002 |

OTHER PUBLICATIONS

"Fractional-N Frequency Synthesizer for Wireless Communications", A.E. Hussein and M.I. Elmasry, IEEE International Symposium on Circuits and Systems, May 26-29, 2002, 5 pgs.

"A Modeling Approach for Σ-Δ Fractional-N Frequency Synthesizers Allowing Straightforward Noise Analysis", Michael H. Perrott, Mitchell D. Trott and Charles G. Sodini, IEEE Journal of Solid-State Circuits, vol. 37, No. 8, Aug., 2002, pp. 1028-1038.

(Continued)

*Primary Examiner*—David Mis
(74) *Attorney, Agent, or Firm*—Eschweiler & Associates, LLC

(57) ABSTRACT

The invention is directed to a phase locked loop with a ΣΔ modulator. A multimodulus divider in the feedback path of the PLL is actuated by the ΣΔ modulator. The latter has a design which can be described by a complex transfer function H(s) in the Laplace plane, said transfer function having a complex-conjugate pair of pole points. The arrangement allows a significant reduction in the noise in critical frequency domains and hence allows adherence to transmission masks based on radio specification even when the PLL bandwidth is as large as the modulation bandwidth.

18 Claims, 3 Drawing Sheets

$$H(s) = \frac{1}{s^2(s+\sigma_1+j\omega_1)(s+\sigma_1-j\omega_1)}$$

OTHER PUBLICATIONS

"Digital Enhanced Cordless Telecommunications (DECT); Common Interface (CI); Part 2: Physical Layer (PHL)", ETSI EN 300 175-2 V1.5.1 (Feb. 2001), 53 pgs.

U.S. Appl. No. 11/145,822, filed Jun. 6, 2005, Li Puma et al.

"A 1.8 GHz CMOS Fractional-N Frequency Synthesizer with Randomized Multi-Phase VCO", Chun-Huat Heng and Band-Sup Song, IEEE Custom Integrated Circuits Conference, May 12-15, 2002, 5 pgs.

"A 27-mW CMOS Fractional-N Synthesizer Using Digital Compensation for 2.5-Mb/s GFSK Modulation", Michael H. Perrot, Theodore L. Tewksbury III and Charles G. Sodini, IEEE Journal of Solid-State Circuits, vol. 32, No. 12, Dec. 1997, pp. 2048-2060.

International Search Report, Int'l Application No. PCT/DE03/03894, Int'l Filing Date Nov. 25, 2003, 2 pgs.

International Search Report, Int'l Application No. PCT/DE03/03949, Int'l Filing Date Dec. 1, 2003, 3 pgs.

"Digitale Verarbeitung Analoger Signale", S. D. Stearns, Oldenbourg Verlag, München, 1988, 5 pgs.

\* cited by examiner $4^{th}$-order ΣΔ modulator

PHASE LOCKED LOOP COMPRISING A ΣΔ MODULATOR

REFERENCE TO RELATED APPLICATIONS

This application is a continuation of PCT/DE03/03894, filed Nov. 25, 2003 which was not published in English, that claims the benefit of the priority date of German Patent Application No. DE 102 57 185.6, filed on Dec. 6, 2002, the contents of which both are herein incorporated by reference in their entireties.

FIELD OF THE INVENTION

The present invention relates to a phase locked loop with a ΣΔ (sigma-delta) modulator.

BACKGROUND OF THE INVENTION

A phase locked loop (PLL) of the generic type is specified in the printed document U.S. Pat. No. 6,008,703. This document describes a frequency synthesizer in which a ΣΔ PLL is used to produce a signal at a modulated carrier frequency. This phase locked loop, which is shown by way of example in FIG. 2A in the indicated prior art document, comprises a forward path with a phase detector, a loop filter and a controlled oscillator and a feedback path which couples the output of the oscillator to the phase detector via a multimodulus divider. To control the multimodulus divider, a digital sigma-delta modulator is provided whose input side is supplied both with information about the desired carrier signal and with digital modulation data. The modulated output signal is provided at the output of the controlled oscillator.

In a phase locked loop of the generic type, the desired frequency modulation is performed digitally by varying the frequency division value. Such frequency synthesizers are used, by way of example, in modern, digital radio systems for carrier frequency generation and for digital frequency modulation.

When stipulating the dimensions of or designing such a phase locked loop, the choice of bandwidth for the phase locked loop is of particularly great importance. In this context, it is necessary to find a compromise between the noise properties of the circuit and the modulation bandwidth. On the one hand, the noise needs to be as low as possible in order to adhere to the spectral transmission masks prescribed in the various radio specifications. This requires the selection of a relatively small loop bandwidth. On the other hand, this is opposed by the fact that transmitting modulated data requires a large bandwidth for modern applications in communications technology.

By way of example, the European Telecommunications Standard "ETSI EN 300 175-2 V1.5.1 (2001-02) DECT (Digital Enhanced Cordless Telecommunications) CI (Common Interface) PART 2: Physical Layer" specifies limits for unwanted radio emissions. The maximum power level for the third and fourth adjacent channels is limited to 80 nW and 40 nW, respectively, for example, see section 5.5, page 24.

A system-related, dominant noise component arises through the quantization noise of the ΣΔ modulator itself. The ΣΔ modulator normally actuates the multimodulus divider and in so doing brings about random changeover between integer division ratios in order to obtain on average that division ratio which brings about generation of the desired output frequency from the PLL.

FIG. 10A of the prior art document U.S. Pat. No. 6,008,703 (which was cited earlier herein) shows a multimodulus divider which comprises a series circuit containing a plurality of frequency divider stages. In this case, the frequency divider stages can each be changed over between precisely two division values and can divide the input frequency either by the division value 2 or by the division value 3. Such frequency divider stages are also called ⅔ frequency dividers. The range of division values which can be set for such a multimodulus divider, which is constructed only from ⅔ divider stages, is determined in line with the following specification:

$$N = N_0 + \sum_{i=0}^{L-1} c_i \cdot 2^i$$

where L denotes the number of ⅔ divider stages and $N_0$ is equal to $2^L$.

The ΣΔ modulator actuating such a multimodulus divider is normally implemented in a "MASH" architecture. A stage in such a multistage MASH modulator is shown by way of example in FIG. 8B of the prior art document U.S. Pat. No. 6,008,703. In this case, a summing element is provided which has two inputs and an output, with an error signal being fed back by means of a feedback path. In this arrangement, the error signal is normally fed back with a delay. A multistage ΣΔ modulator with MASH architecture is illustrated in FIG. 8A with the aid of a block diagram.

The ΣΔ modulator distributes the power of the quantization noise in line with its noise transfer function over the frequency band. The noise transfer function (NTF) of the MASH structure can be described by the equation $$NTZ(z) = (1-z^{-1})N$$

where N represents the order of the modulator. The quantization noise is in this case shifted from lower frequencies to higher frequencies. The actuation of the multimodulus divider by the ΣΔ modulator brings about random changeover of the division values in line with the spectral distribution of the quantization noise. The random changeover of the division factor in turn brings about a change in the frequency over time and thus produces a "frequency or phase interference swing" (FM or PM interference swing). This is also called residual FM jitter in the literature, or else phase noise. The magnitude of this interference swing determines the signal-to-noise ratio (SNR) of the frequency-modulated or phase-modulated carrier signal and therefore has significant effects on the performance of a radio receiver of such design, for example on its range.

In the case of the frequency synthesizer based on U.S. Pat. No. 6,008,703, the explained noise demands mean that the bandwidth of the phase locked loop is made significantly smaller than is actually required for transmitting the modulated data. To compensate for the resultant frequency response of the loop filter in the PLL, the data to be modulated are subjected to digital precompensation before being supplied to the ΣΔ modulator. This involves high frequency components being raised digitally.

A fundamental drawback of this design is the very accurate matching which is required between the digital compensation filter, on the one hand, and the analog loop filter, on the other. This is because if the bandwidth of the control loop changes as a result of analog influences such as manufacturing tolerances, temperature drifts or ageing phenomena, the digital precompensation (which is not subject to these influences in practice) raises the high frequency components too much or too little.

Another option for compensating for a reduced loop bandwidth is provided by "two-point modulation". This involves modulation at two modulation points in the phase locked loop, first on the frequency divider and secondly at the oscillator input. In this case, one of the two modulation points of the PLL has low-pass filter properties and the other has high-pass filter properties. The overall result is therefore a constant transfer function for the modulation data. In this case too, however, the problem of accurate matching being required between the analog and digital signal paths (which problem has already been explained) arises.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a phase locked loop with a $\Sigma\Delta$ modulator which affords a large modulation bandwidth, allows adherence to spectral transmission masks as provided in the mobile radio standards, and avoids the problem of mismatches between analog and digital circuit parts.

The invention comprises a phase locked loop with a $\Sigma\Delta$ modulator that comprises a feedback path which couples the output of a summing element to an input thereof and which is designed such that the complex transfer function representing the feedback path has a complex, nonzero pair of pole points in the Laplace plane.

In this case, the complex transfer function representing the feedback path may also contain a plurality of complex, nonzero pairs of pole points in the Laplace plane.

The present invention is based on the "error feedback topology" of a $\Sigma\Delta$ architecture. In comparison with a MASH structure, which in line with its transfer function in the Laplace plane $H(s)=1/s^3$ has a triple pole point at s=0, the present invention involves implementing a transfer function with at least one complex-conjugate pair of pole points. Suitable selection of the imaginary and real parts of the complex pair of pole points means that there is no difficulty in ensuring adherence to the spectral transmission masks required in radio specifications.

The complex transfer function H(s) in the Laplace plane is used to determine the associated noise transfer function as $NTF(z)=1-H(z)$.

The complex pole pair provided in accordance with the present invention, which pole pair differs from zero, makes it possible to reduce the noise in a critical frequency range. In this case, the imaginary part of the additional, complex pair of pole points determines the center frequency error, while the real part stipulates the suppression of the noise for this center frequency error.

The architecture of the present invention makes it possible to stipulate the dimensions of a noise transfer function, which can be optimized for the spectral transmission mask specifically by taking into account the requirements.

In the DECT (Digital Enhanced Cordless Telecommunication) system, for example, the demands on the spectral power transmission in the frequency interval at 4 MHz to 8 MHz are normally critical for adherence, this being in line with the third and fourth adjacent channels, since firstly the $\Sigma\Delta$ quantization noise still rises greatly and is not sufficiently attenuated by the loop filter, and secondly the transmitted power in the adjacent channel may be only 80 or 40 nW, in line with the third and fourth adjacent channels. This is stipulated in the ETSI standard for the physical plane in the DECT standard.

In accordance with the present invention, transmission arrangements with the phase locked loop can be provided for generating frequency-modulated or phase-modulated signals. Alternatively, the phase locked loop described can be used in a frequency synthesizer for providing a carrier frequency.

The described invention is used to transmit the full modulation bandwidth via the phase locked loop. In this context, the bandwidth of the phase locked loop is advantageously as large as the modulation bandwidth. It is thus possible for the high matching demands of known transmission designs between the analog phase locked loop and the digital signal processing part of the $\Sigma\Delta$ PLL to be circumvented.

To allow the large phase locked loop bandwidth, in summary, a $\Sigma\Delta$ modulator is used taking into account the spectral transmission mask. To this end, as explained, the present invention involves a complex zero point being inserted in the noise transfer function in the critical adjacent channel, said zero point resulting in adherence to the transmission mask despite the larger bandwidth.

In accordance with one embodiment of the invention, the complex transfer function H(s) described on the basis of the Laplace variable s has not only the complex pair of pole points but also a double pole point at the value s=0.

By way of example, the complex transfer function of the feedback path preferably satisfies the equation $$H(s) = \frac{1}{s^2 \cdot (s + \sigma_1 + j\omega_1) \cdot (s + \sigma_2 - j\omega_2)}$$

or more generally:

$$H(s) = \frac{1}{\prod_{i=0}^{n} (s + \sigma_i \pm j\omega_i)}$$

where $\sigma_i$ is less than or equal to zero and at least one $\sigma_i$ differs from zero.

In accordance with another embodiment of the present invention, the frequency divider is in the form of a "multimodulus divider". By way of example, the multimodulus divider may have a range of adjustable division values from 32 to 63. This allows a further frequency range to be covered by the phase locked loop with a modulator.

In accordance with one embodiment of the present invention, a further frequency divider is provided at the output of the controlled oscillator. In this arrangement, the further frequency divider has a plurality of outputs which each provide mutually phase-shifted signals.

In this case, the output of the phase locked loop is formed at the output of the further frequency divider, not directly at the output of the controlled oscillator. The oscillator oscillates at a higher frequency corresponding to the frequency division ratio of the further frequency divider.

In addition, the invention, in one example, includes a multiplexer with a plurality of inputs. In this case, each output of the further frequency divider has an associated input to the multiplexer, and is connected thereto. The output of the multiplexer is connected to the input of the multimodulus divider.

In accordance with another embodiment, the multimodulus divider is supplied with the output signal from the phase locked loop with a selectable phase shift. This brings about a reduction in the divider stepsize ΔN to values of less than 1 relative to the output frequency, which means that the quantization noise is distributed over a smaller frequency range and thus results in a reduced interference swing. This results in a further improvement in the options for adhering to the spectral transmission mask of a mobile radio standard.

The control input of the multiplexer is, in one example, connected to the ΣΔ modulator for preselecting the phase shift.

The further frequency divider comprises in one example a :2 frequency divider. In this case, the frequency of the signal provided at the output of the controlled oscillator corresponds to twice the output frequency of the phase locked loop.

In one example, the further frequency divider has four outputs which provide the signal at the output frequency of the phase locked loop after phase shifting in steps of 90° relative to one another. This reduces the divider stepsize ΔN from 1 to 0.25 relative to the output frequency of the PLL.

In accordance with yet another embodiment of the invention, the multimodulus divider comprises a series circuit containing a plurality of ⅔ frequency divider stages, which can be changed over between a frequency division ratio of 2 and a frequency division ratio of 3, respectively. In this case, the frequency division ratio of 2 corresponds to a halving of the frequency. The frequency division ratio of 3 means that the input signal frequency is divided by 3.

The phase locked loop contains in one example a charge pump circuit with a downstream loop filter in order to couple the phase comparator to the controlled oscillator. In this case, the loop filter is designed for a loop bandwidth which is the same as the modulation bandwidth.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in more detail using exemplary embodiments with reference to the drawings, in which.

DETAILED DESCRIPTION OF THE INVENTION

Figure 1:
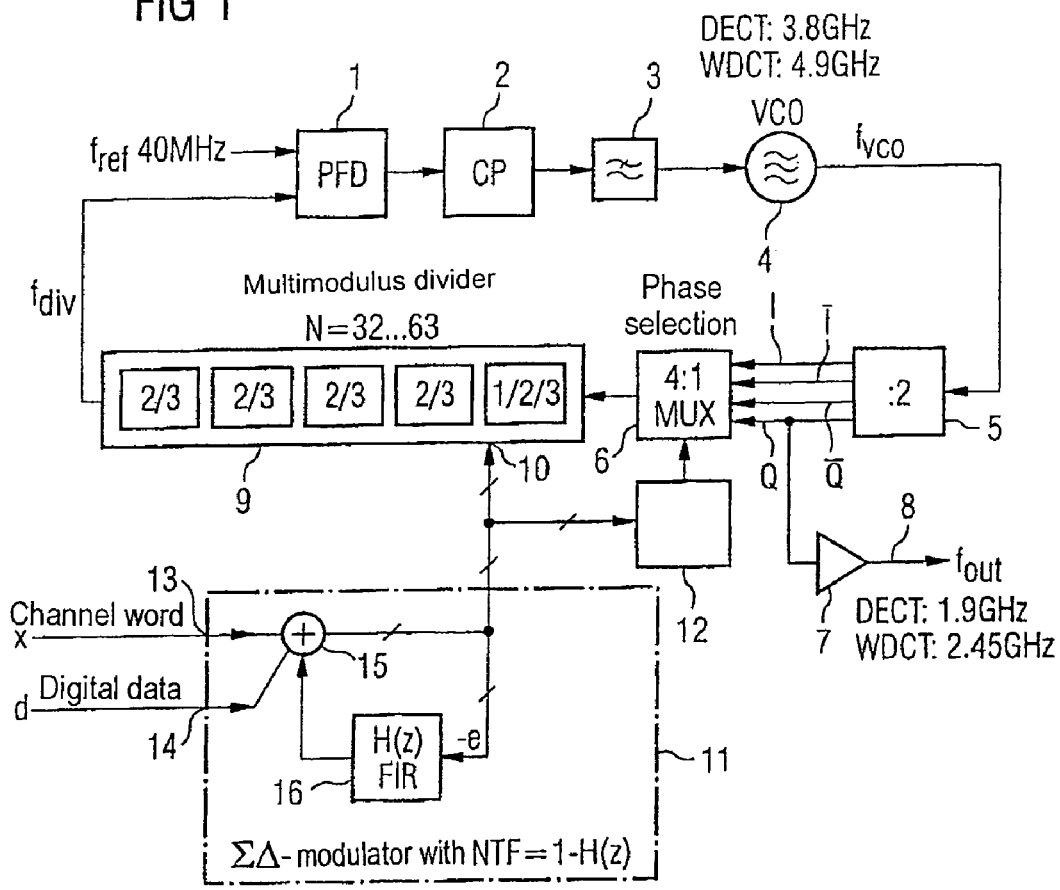
FIG. 1 is a block diagram illustrating a phase locked loop with ΣΔ modulation in one exemplary embodiment of the invention.

FIG. 1 shows a phase locked loop with a phase comparator 1 having two inputs and an output. One of the two inputs of the phase detector or phase comparator 1 can have a reference frequency generator (not shown here) connected to it which delivers a reference frequency $F_{ref}$. The output of the phase detector 1 has a voltage controlled oscillator 4 connected to it via a charge pump circuit 2 and a loop filter 3, which is in the form of a low-pass filter and which is connected downstream of the charge pump circuit 2. The output of the oscillator 4 has a 4:1 multiplexer 6 connected to it via a :2 frequency divider 5. The :2 frequency divider 5 has four outputs at which it is possible to tap off the signal at the output frequency $F_{out}$ of the phase locked loop in four different phases. One of the four outputs of the frequency divider 5 forms the output 8 of the phase locked loop via an amplifier 7.

The four outputs of the frequency divider 5 are connected to a respective associated input of the multiplexer 6, which is arranged in a feedback path of the phase locked loop. The output of the multiplexer 6 is connected to a further input of the phase detector 1 via a multimodulus divider 9. The multimodulus divider 9 comprises in this example a series circuit containing a total of five frequency divider stages. Each frequency divider stage is designed as a ⅔ frequency divider, in which the frequency division value can be changed over between 2 and 3. The control inputs of the frequency divider stages are combined to form a programming input 10 for the multimodulus divider 9. At the programming input 10, it is possible to set the desired frequency division value of the multimodulus divider in a range N between 32 and 63. The programming input 10 is connected to the output of a ΣΔ modulator 11. The output of the ΣΔ modulator 11 also has the control input of the multiplexer 6 connected to it via a control unit 12.

The ΣΔ modulator 11 comprises a first input 13 for supplying a channel word, that is to say information about the phase locked loop's channel which is to be set. A further input 14 is used to supply the digital modulation data. The two inputs 13, 14 are connected to one another and to a feedback path in a summing element 15. The feedback path returns the output of the summing element 15 to an input of the summing element via a finite impulse response (FIR) filter 16. The FIR filter 16 has a transfer function H(z) which is complex. In the Laplace plane, the transfer function H(s) can be described, through transformation, by the formula $$H(s) = \frac{1}{s^2 \cdot (s + \sigma_1 + j\omega_1) \cdot (s + \sigma_2 - j\omega_2)}$$

The noise transfer function NTF of the ΣΔ modulator 11 is in this case determined in the z plane from NTF(z)=1−H(z).

In the ΣΔ fractional N PLL of the present invention, the oscillator 4 oscillates at twice the output frequency $f_{out}$. The oscillator 4 is controlled by a comparison result for a reference frequency $f_{ref}$ and the divided-down frequency $f_{div}$ provided by the multimodulus divider 9. In the phase locked loop's forward path 1, 2, 3, 4, 5 there is an additional frequency divider 5. This provides the output frequency in four different phases between which it is possible to select using the multiplexer 6. With reference to the output frequency $f_{out}$ from the PLL, a stepsize ΔN referring to the division ratio is thus produced which is less than 1. The proposed PLL allows changeover not only in frequency steps which are prescribed by the reference frequency $f_{ref}$, in the present case 40 MHz, but also in stepsizes of 10 MHz which are governed by the factor 0.25.

The smaller stepsize means that the instantaneous frequency varies over a smaller frequency range, so that the quantization noise is also reduced by the factor of the division step reduction. When four different phases are used, as in the present case, the interference swing is reduced by the factor 4, which corresponds to a spectral reduction in the phase noise of 12 dB. The two least significant bits of the ΣΔ modulator 11 are used to actuate the multiplexer 6 via the control unit 12. Five further control bits in the ΣΔ modulator are used to program the division value of the multimodulus divider 9.

In comparison with a conventional MASH structure, whose transfer function in the Laplace plane is a triple pole point at s=0, the ΣΔ modulator of the present invention contains a chosen complex-conjugate pair of pole points $$s_{1,2} = -\sigma 1 \pm j\omega 1$$

such that the pole point is at that frequency or in that frequency range which needs to be reduced on account of the frequency mask that is to be adhered to.

The inserted complex pole point of the present invention significantly reduces the noise in the critical frequency range. In this case, the imaginary part ω1 of the complex-conjugate pole pair $s_{1,2}$ determines the frequency to be reduced, while the real part −σ1 stipulates the measure of suppression at this frequency.

The present invention relates to a transmitter design with a high level of spectral purity which can be used either to generate frequency-modulated and/or phase-modulated signals or else as a frequency synthesizer. Since the invention allows the full modulation bandwidth to be transmitted via the phase locked loop, a ΣΔ modulator 11 with the noise transfer function NTF(z)=1−H(z) is used taking into account the spectral transmission mask that is to be adhered to. To this end, as proposed, a complex zero point is inserted into the noise transfer function in the critical adjacent channel, and this results in adherence to the transmission mask despite the larger bandwidth which is available.

In the case of the exemplary embodiment shown in FIG. 1, the phase locked loop with a ΣΔ modulator is designed such that it can be used for the DECT system in a frequency band from 1880 MHz to 1900 MHz and at the same time for WDCT in the ISM band in a frequency range from 2.40 to 2.48 GHz. To this end, it is possible to set division values between 32 and 63.75 with a stepsize of 0.25.

To cover the two frequency bands, a dual band extension of the PLL may either contain a second VCO, or the oscillator 4 can be equipped with a switchable frequency band.

The loop bandwidth is advantageously so large that modulation via the data input 14 is possible.

Figure 2:
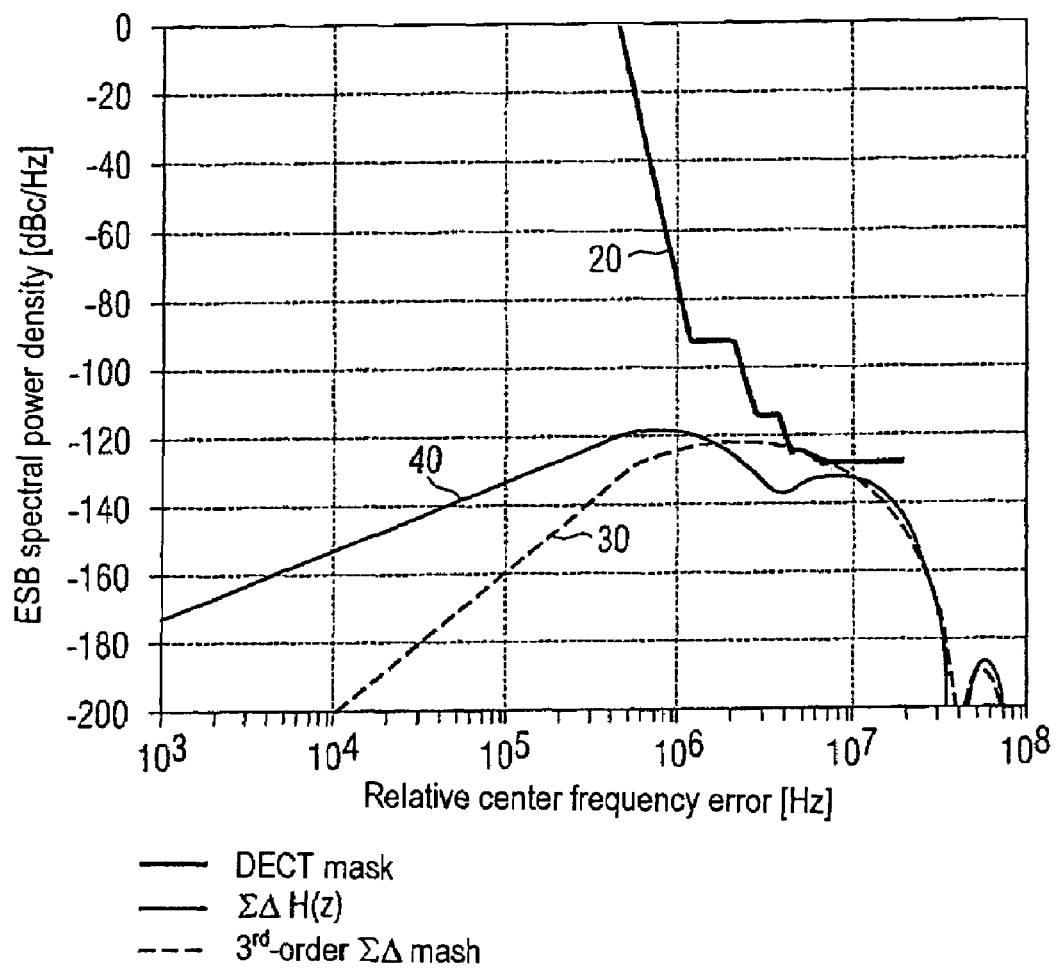
FIG. 2 is a graph illustrating the transmission mask in accordance with the DECT specification and the frequency profile in accordance with the invention and the prior art, respectively, with the spectral power density being plotted against frequency.

FIG. 2 uses a semilogarithmic graph to show the spectral power density in dBc per Hertz plotted against the relative center frequency error in Hertz. The transmission mask to be adhered to in line with the DECT specification in the present example is shown by means of a curve and has been provided with the reference symbol 20. The frequency profile which can be obtained, as described at the outset, using a conventional third-order ΣΔ-MASH modulator has been provided with the reference symbol 30. It can be seen that the DECT mask cannot be adhered to in optimum fashion in a frequency range between $10^6$ and $10^7$ Hz. Reference symbol 40 denotes the profile of the noise transfer function which can be attained using the arrangement of the present invention shown in FIG. 1.

The advantageous effect of the complex-conjugate pole point inserted into the modulator's feedback path in line with the invention can clearly be seen in FIG. 2. This pole point causes a significant reduction in the transmitted spectral noise power to be attained precisely in the critical frequency range. The DECT mask can thus be adhered to without a problem.

Figure 3:
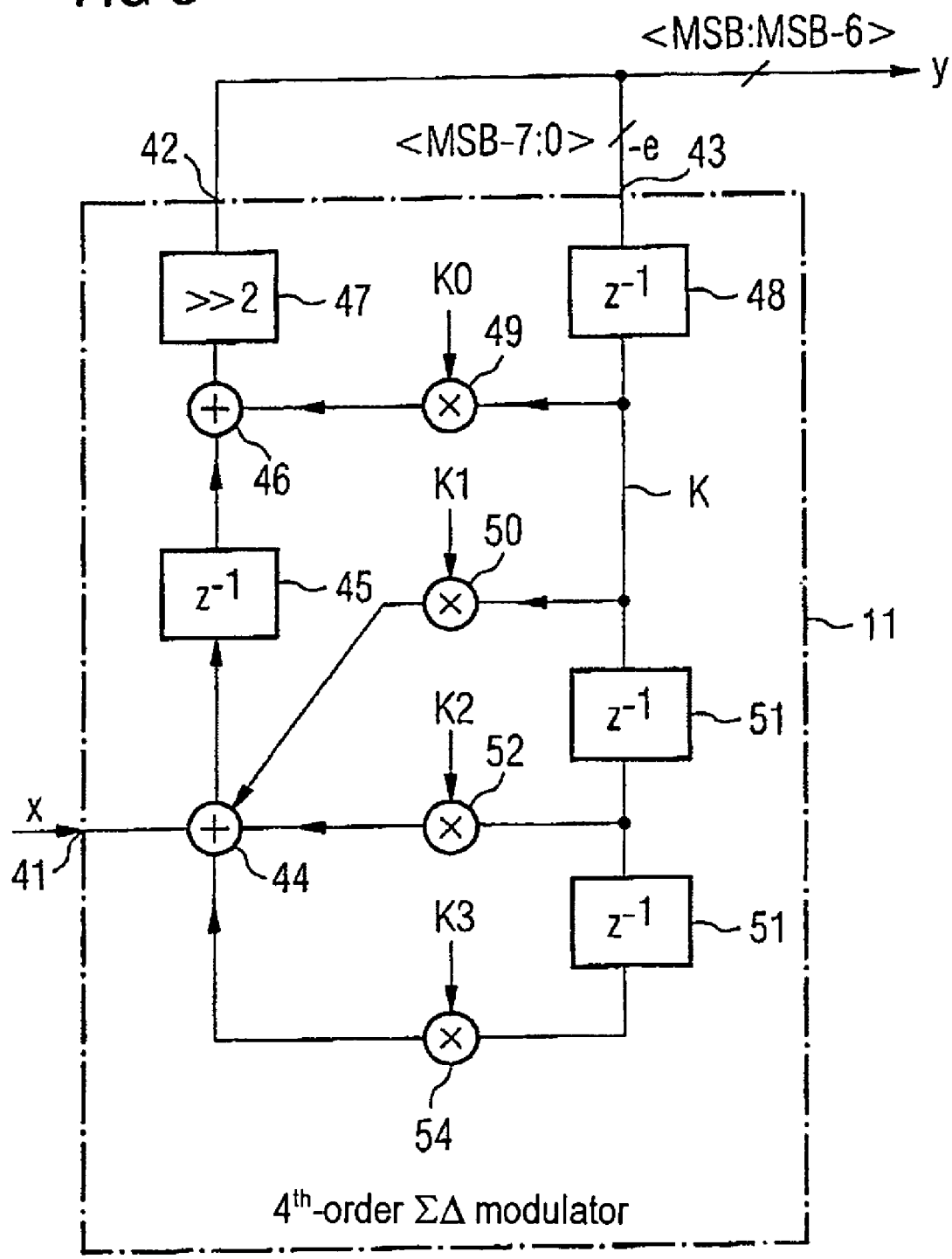
FIG. 3 is a block diagram illustrating an exemplary embodiment of a 4th-order ΣΔ modulator as shown in FIG. 1 with a noise transfer function as shown in FIG. 2.

FIG. 3 is a block diagram illustrating an exemplary embodiment of the ΣΔ modulator 11 from FIG. 1, which is implemented in line with the equation $$H(s) = \frac{1}{s^2 \cdot (s + \sigma_1 + j\omega_1) \cdot (s + \sigma_2 - j\omega_2)}$$

that is valid in the Laplace plane.

The 4th-order ΣΔ modulator shown in FIG. 3 has a signal input 41, a signal output 42 and an error feedback input 43 which is connected to the output 42.

The input 41 has a first summing element 44 connected to it with three inputs and an output. The output of the summing element 44 is connected via a 1/z element 45 and a second summing element 46 to a signal block 47 which shifts the digital signal two bits to the right. The output of the block 47 forms the output 42 of the modulator. The error signal feedback input 43 is connected to a node K via a 1/z element 48. A signal path leads from the node K via a multiplier with the factor K0, which is provided with reference symbol 49, to a further input of the second summing element 46. In addition, the node K is connected to an input of the first summing element 44 via a multiplying element 50, which multiplies by the factor K1. The node K is also connected to an input of the summator 44 via a 1/z element 51 and via a multiplier 52 which multiplies by the factor K2. Finally, the output of the 1/z element 51 is connected to the first summing element 44 via a further 1/z element 53 and via a multiplier which operates with the factor K3 and has the reference symbol 54. The signal diagram shown in FIG. 3 which has been described describes a ΣΔ modulator 11 whose attained noise transfer function corresponds to the profile 40 from FIG. 2 on the basis of the inserted complex-conjugate pole point.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A phase locked loop, comprising:
a phase comparator comprising two inputs and an output;
a controlled oscillator comprising a control input coupled to the output of the phase comparator;
a frequency divider comprising a signal input coupled to an output of the controlled oscillator, an output, and a control input for preselecting a division ratio associated therewith; and
a sigma-delta modulator connected to the control input of the frequency divider, wherein the sigma-delta modulator comprises a feedback path that couples an output of a summing element to an input thereof, and is configured having a complex transfer function representing the feedback path comprising at least one complex, nonzero pair of pole points in the Laplace plane.

2. The phase locked loop of claim 1, wherein the complex transfer function of the sigma-delta modulator is described on the basis of the Laplace variable s, and further comprises at least one pole point at the value s=0.

3. The phase locked loop of claim 1, wherein the complex transfer function of the feedback path of the sigma-delta modulator satisfies the equation $$H(s) = \frac{1}{\prod_{i=0}^{n}(s + \sigma_i \pm j\omega_i)}$$

where $\sigma_i$ is less than or equal to zero and at least one $\sigma_i$ differs from zero.

4. The phase locked loop of claim 1, wherein the frequency divider comprises a multimodulus divider.

5. The phase locked loop of claim 4, further comprising:
a further frequency divider coupled to the output of the controlled oscillator, the further frequency divider comprising a plurality of outputs that each provide divided, mutually phase-shifted signals; and
a multiplexer comprising a plurality of inputs that are each associated with and connected to the outputs of the further frequency divider, with an output connected to the input of the multimodulus divider, and with a control input.

6. The phase locked loop of claim 5, wherein the further frequency divider comprises a division-by-two frequency divider such that the frequency of a signal provided at the output of the controlled oscillator corresponds to twice the output frequency at the output of the further frequency divider.

7. The phase locked loop of claim 5, wherein the further frequency divider comprises four outputs, and is configured to provide four signals that are phase-shifted in steps of 90 degrees relative to one another, as the output frequency of the phase locked loop.

8. The phase locked loop of claim 4, wherein the multimodulus divider comprises a series circuit containing a plurality of 2/3 frequency divider stages that are configured to change over between a frequency division ratio of two and a frequency division ratio of three.

9. The phase locked loop of claim 1, further comprising a series circuit comprising a charge pump circuit and a loop filter coupled between the phase comparator and the control input of the controlled oscillator.

10. A phase locked loop, comprising:
a phase comparator configured to compare a reference frequency signal with a divided feedback signal, and generate a control signal in response thereto;
a controlled oscillator configured to generate a controlled frequency signal as a function of the control signal;
a programmable frequency divider circuit configured to receive a feedback signal associated with the controlled frequency signal and generate the divided feedback signal by dividing the feedback signal by a value that is based on a division control signal coupled thereto; and
a sigma-delta modulator configured to generate the division control signal based on modulation data supplied thereto, the sigma-delta modulator comprising an internal control loop having a feedback path, wherein a complex transfer function of the feedback path comprises at least one complex, nonzero pair of pole points in the Laplace plane.

11. The phase locked loop of claim 10, wherein the complex transfer function of the feedback path in the sigma-delta modulator further comprises at least one further pole point at the value s=0 in the Laplace plane.

12. The phase locked loop of claim 10, wherein the complex transfer function of the feedback path in the sigma-delta modulator satisfies the equation:

$$H(s)=1/[s^2(s+\sigma_1+j\omega_1)(s+\sigma_1-j\omega_1)],$$

wherein $\omega_1$ represents a frequency to be suppressed, and $\sigma_1$ represents an amount of suppression at the frequency.

13. The phase locked loop of claim 10, further comprising:
A further frequency divider circuit configured to receive the controlled frequency signal from the controlled oscillator and output a plurality of divided down controlled frequency signals each having differing, varied phases with respect to one another, and wherein an output of the phase locked loop is taken from one of the divided down controlled frequency signals; and
A multiplexer configured to receive the plurality of divided down controlled frequency signals and selectively pass one of the signals to the programmable frequency divider circuit based on a selection signal provided by the sigma-delta modulator.

14. The phase locked loop of claim 13, wherein the sigma-delta modulator is further configured to generate the selection signal provided to the multiplexer based on the division control signal.

15. The phase locked loop of claim 13, wherein the plurality of divided down controlled frequency signals are consecutively ninety degrees out of phase with one another.

16. The phase locked loop of claim 10, further comprising a series circuit comprising a charge pump and a loop filter configured to generate a tuning signal for the controlled oscillator based on the control signal from the phase comparator.

17. The phase locked loop of claim 1, wherein the feedback path of the sigma-delta modulator comprises a finite impulse response filter.

18. The phase locked loop of claim 10, wherein the feedback path of the sigma-delta modulator comprises a finite impulse response filter.

* * * * *